United States Patent
Wu

(10) Patent No.: US 7,310,508 B2
(45) Date of Patent: Dec. 18, 2007

(54) INLINE FILTER RESISTORS

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 680 days.

(21) Appl. No.: 10/815,058

(22) Filed: Mar. 31, 2004

(65) Prior Publication Data

US 2005/0227664 A1    Oct. 13, 2005

(51) Int. Cl.
*H04B 1/28* (2006.01)
(52) U.S. Cl. .................. 455/333; 455/73; 455/307
(58) Field of Classification Search .................. 455/73, 455/213, 333, 307; 375/334, 377, 272, 273
See application file for complete search history.

(56) References Cited

U.S. PATENT DOCUMENTS 4,142,158 A * 2/1979 Belisomi .................. 455/183.1
5,894,499 A * 4/1999 Katayama et al. .......... 375/334
6,111,606 A * 8/2000 Ikeda .......................... 348/241
6,172,954 B1 * 1/2001 Masuda .................... 369/47.26
6,335,656 B1 * 1/2002 Goldfarb et al. ............ 327/559

* cited by examiner

Primary Examiner—Sanh D. Phu
(74) Attorney, Agent, or Firm—Garlick Harrison & Markison; James A. Harrison

(57) ABSTRACT

A shorted resistive block formed in line with at least one trace of a plurality of a top metal layer includes a plurality of resistors with a removable shorting link coupled across the resistive block. The resistive block comprises one of a plurality of series coupled shorted resistors and a shorted plurality of parallel coupled resistors. If harmonic interference needs to be reduced, a short is removed and the resistive block is operably coupled to parasitic capacitance thereby creating an R-C filter. The real performance is re-evaluated after removing the short. If the re-evaluation determines a desired R-C filter value should be increased, the resistance of the resistive block is increased by opening a shorting link. In the series configured resistive block, resistance is increased by removing a short across a resistor. In the parallel configuration, the resistance is increased by cutting a removable link coupled in series with each resistor.

21 Claims, 10 Drawing Sheets series coupled resistors

FIG. 3 harmonic signals

FIG. 4 mixed signal integrated circuit transceiver 100

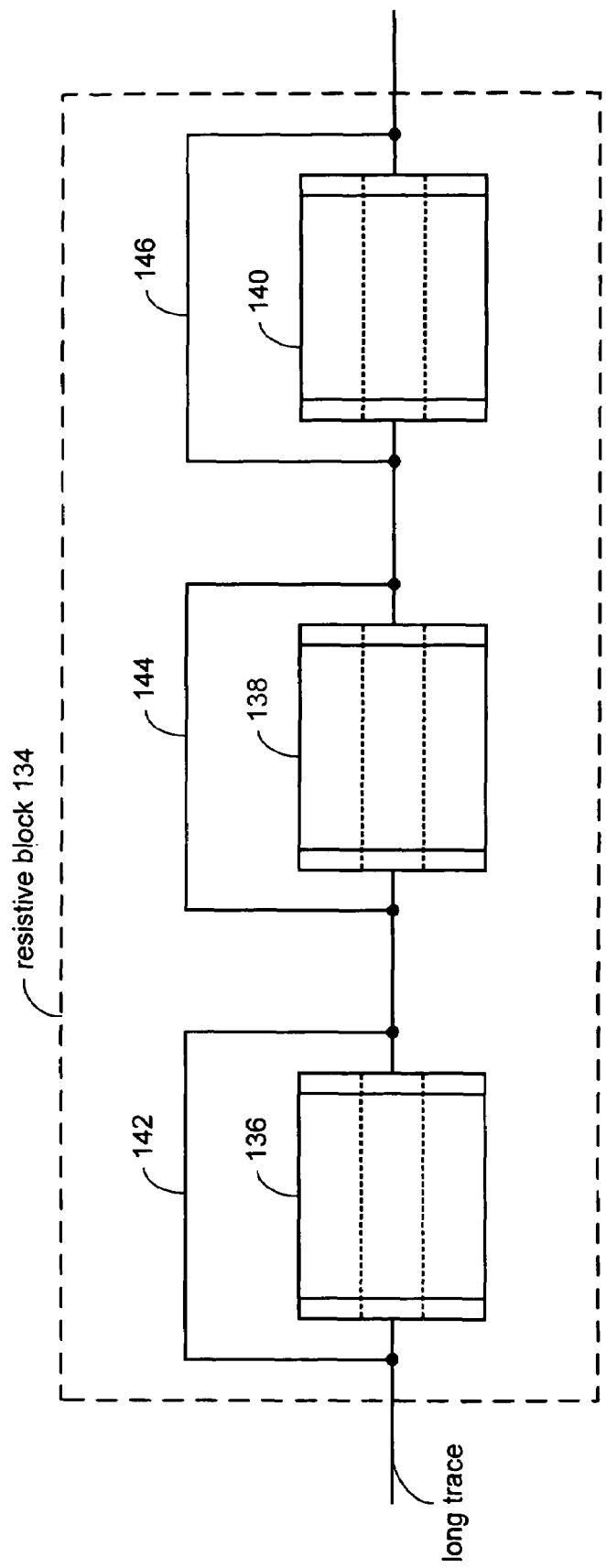
FIG. 6 series coupled resistors

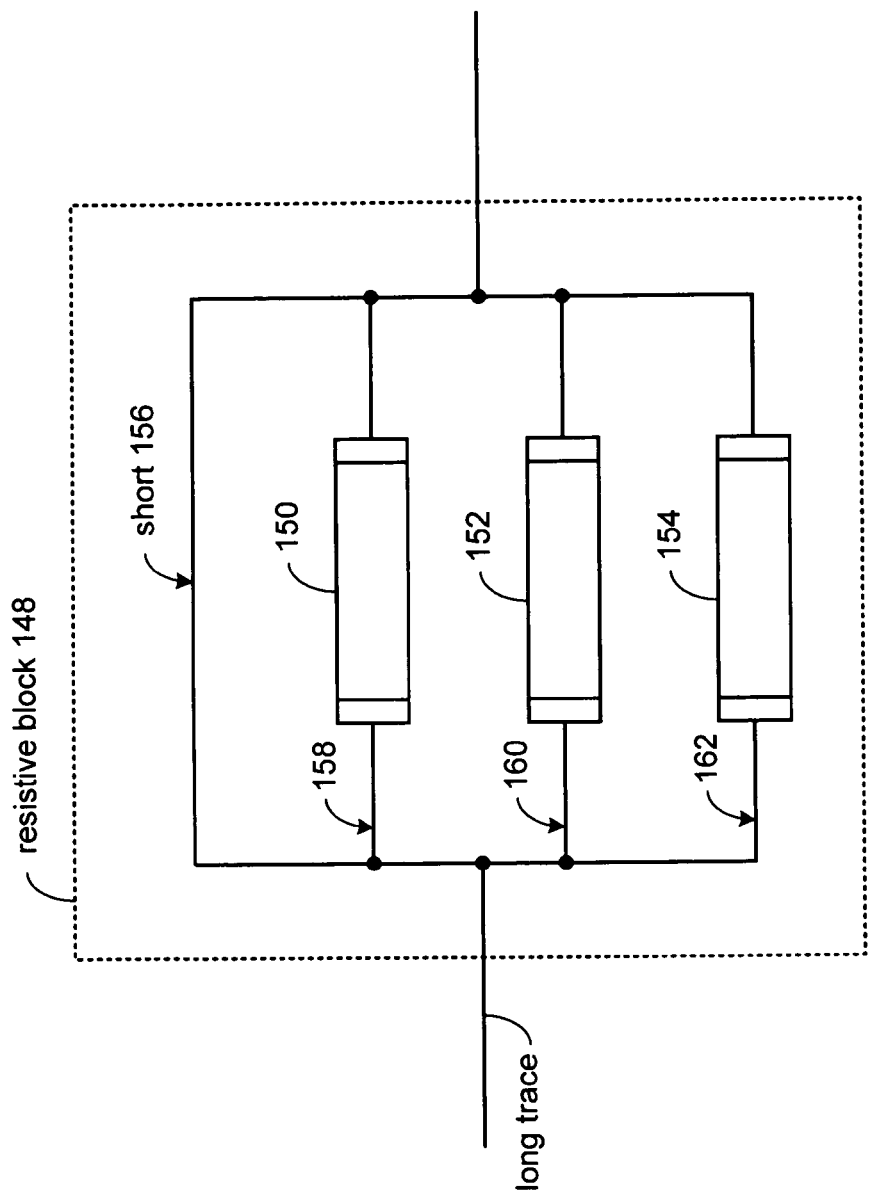
FIG. 7 parallel coupled resistors

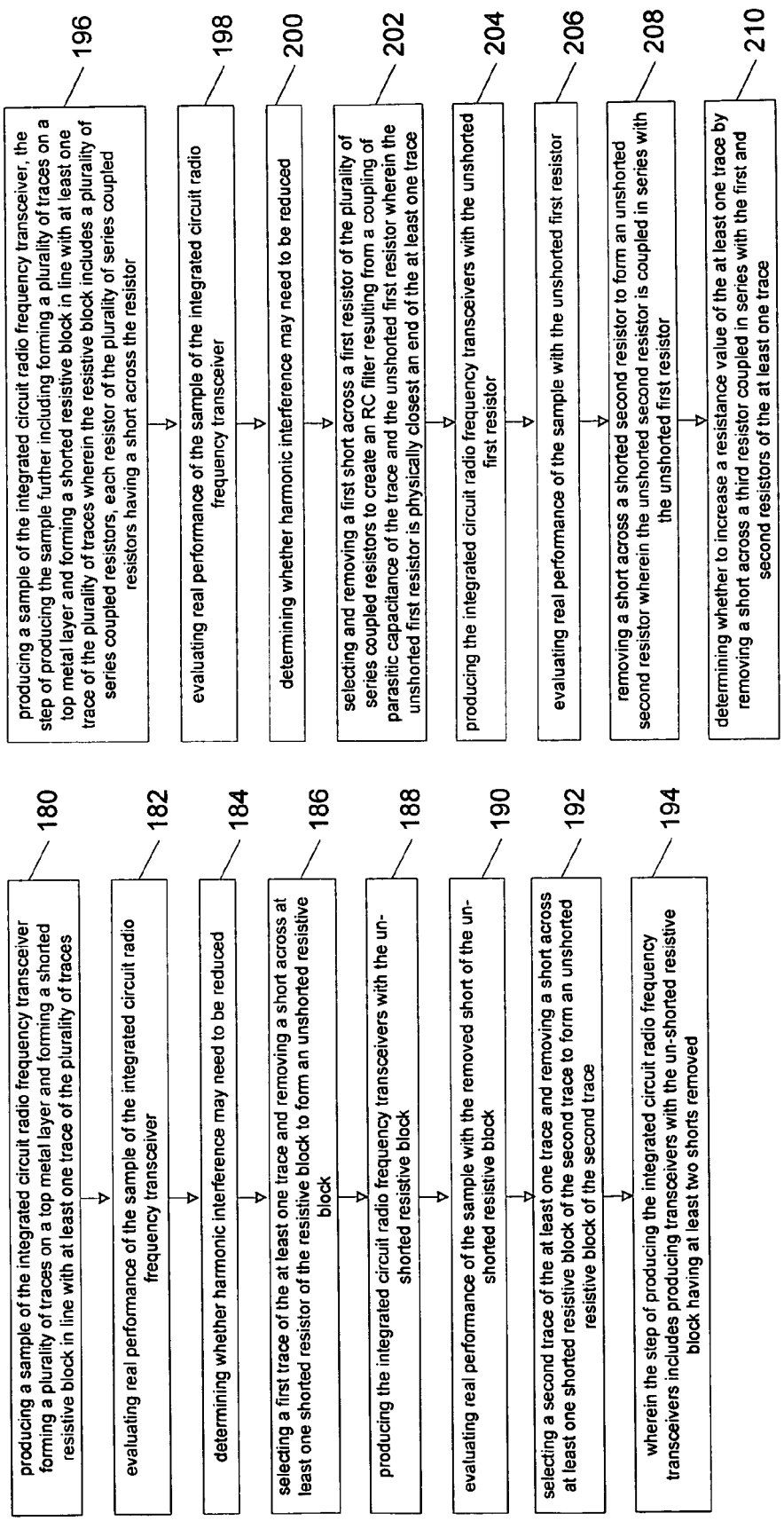

INLINE FILTER RESISTORS

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, Advanced Mobile Phone Services (AMPS), digital AMPS, Global System for Mobile Communications (GSM), Code Division Multiple Access (CDMA), Local Multipoint Distribution Systems (LMDS), Multipoint Multichannel Distribution Services (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a Public Switched Telephone Network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage (demodulator). The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

Phase locked loops (PLLs) are becoming increasingly popular in integrated wireless transceivers as components for frequency generation and modulation. PLLs are typically used for one of a variety of functions, including frequency translation to up-convert a baseband (BB) signal to an intermediate frequency (IF) or to up-convert a baseband or IF signal to RF prior to amplification by a power amplifier and transmission (propagation). PLLs allow for a high degree of integration and, when implemented with the appropriate amount of programmability, can form a main building block for modulators that operate over a wide range of frequencies. Typically, a baseband processor produces a baseband digital signal that is converted to a continuous waveform signal by a digital-to-analog converter (DAC). The continuous waveform signal constitutes the analog baseband signal that requires up-converting to IF and then RF.

A class of PLL-based transmitters, known as translational loops, has become particularly popular. Briefly, in a translational loop, the desired modulated spectrum is generated as some low IF or at DC and then is translated to the desired RF using a PLL. In applications with non-constant envelope modulation, a parallel path for amplitude variation modulates the output power amplifier to generate the desired amplitude variation. One problem with current translational loops, however, is that reference signals, and especially IF reference signals, couple to an output VCO of the translational loops through undesired circuit paths. This phenomenon is referred to as "reference feedthrough" or "IF feedthrough" and is particularly prevalent in low voltage supply CMOS technologies optimized for digital processing. Many wireless communication standards, for example the GSM standard for cellular communications, impose strict limits on the spurious emissions of a given transmitter. Since reference feedthrough manifests itself as spurious emission in the RF output, many design efforts go into ensuring adequate attenuation of the reference feedthrough when designing a translational loop type transmitter for GSM. For example, when employing a 26 MHz reference signal, the GSM standard limits the reference feedthrough to −79 dBm (measured over a 100 kHz per Newton bandwidth). Normalized to a transmitter with an output power of +33 dBm (a typical GSM specification), the limitation on the reference feedthrough is −112 decibels relative to the carrier (dBc).

The closed loop PLL signal filter of the translational loop can be used to attenuate the reference feedthrough since this is an input referred to as? noise source. However, as it turns out, in CMOS technology the level of reference feedthrough is typically so significant that the closed loop PLL signal filter must be made very narrow, e.g., a few hundred kilo-hertz (kHz), (KHz per Newton) in order to attenuate the reference feedthrough to an acceptable level. This, however, in turn, imposes a large distortion on the transmitted signal and causes the transmitter to fail the modulation accuracy requirements of GSM.

For these and other reasons, radio circuits are being developed with many tradeoffs. On one hand, a need exists for transceivers that provide fast response to incoming signals. A need also exists, however, for transceivers that adequately filter noise, feedthrough, harmonics and other undesirable signals in the signal path.

SUMMARY OF THE INVENTION

Thus, it is desirable to produce a transceiver that can be modified in test to optimize the tradeoff between a slower rise time and sensitivity to supply noise and mutual coupling from long traces throughout the integrated circuit. The present inventive integrated circuit radio transceiver comprises front end transceiver circuitry for receiving and transmitting wireless communication signals wherein the front end transceiver front-end processes received RF signals and converts the processed signals to digital signals and converts outgoing digital signals to analog and up-converts the outgoing analog signals to RF and amplifies outgoing RF signals. The integrated circuit radio transceiver includes a plurality of traces on a top metal layer.

A shorted resistive block is formed in line with the at least one trace of the plurality of top metal layer traces. The resistive block includes a plurality of resistors with a removable shorting link coupled across the resistive block. The real performance of the sample of the integrated circuit radio frequency transceiver is evaluated to determine if harmonic interference needs to be reduced. If reduction is necessary, the short is removed and the real performance is re-evaluated. The un-shorted resistor is operably coupled to circuit parasitic capacitance thereby creating an R-C filter that substantially filters harmonics coupled to the long traces from power supply and digital clocks.

The resistive block, according to one embodiment of the present invention, comprises a plurality of series coupled shorted resistors. If harmonic interference needs to be reduced, a first shorted resistor of the plurality of shorted resistors is un-shorted. The first shorted resistor is the resistor that is physically closest to an end of the at least one trace. The real performance is re-evaluated after removing the short. Additional series coupled shorted resistors are un-shorted sequentially to achieve the desired R-C time constant.

In an alternate embodiment of the present invention, the shorted resistive block comprises a short in parallel with a plurality of parallel coupled resistors wherein each of the parallel coupled resistors includes a shorting link coupled in series with the resistor thereby allowing each resistor to be removed from the parallel connection. The short across the shorted parallel coupled resistors is removed and the performance is re-evaluated. Parallel coupled resistors, as is known to one of average skill in the art, have a parallel resistive value that is less than any of the individual resistors. If the re-evaluation determines a desired R-C filter value should be increased, the first resistor of the parallel coupled resistors is un-shorted to increase the resistance of the un-shorted resistive block. A method of the present invention includes determining whether to increase a resistance value of the resistive block by removing a second resistor coupled in parallel within the resistive block

BRIEF DESCRIPTION OF THE DRAWINGS

A better understanding of the present invention can be obtained when the following detailed description of the preferred embodiment is considered with the following drawings, in which:

FIG. 6 is a functional schematic block diagram of a plurality of resistors formed within a resistive block in an integrated circuit that are each shorted and coupled in series relative to each other;

FIG. 7 shows an alternate embodiment of a plurality of resistors formed in-line with a long trace;

FIG. 9 is a flowchart illustrating a method for producing integrated circuit radio frequency transceivers according to one embodiment of the present invention;

FIG. 10 is a flowchart illustrating a method according to the present invention for producing an integrated circuit radio frequency transceiver.

DETAILED DESCRIPTION OF THE DRAWINGS

Figure 1:
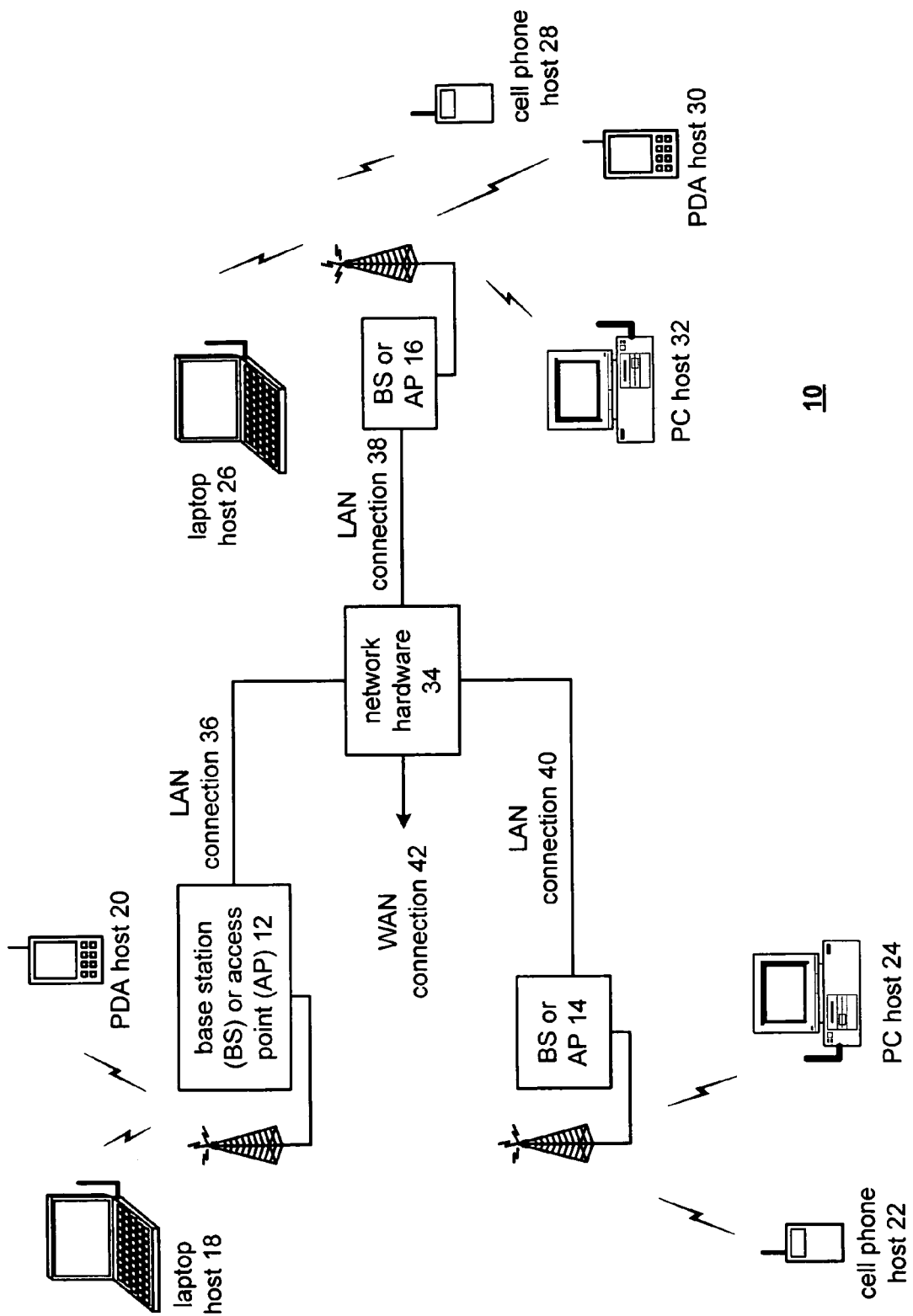
FIG. 1 is a functional block diagram illustrating a communication system that includes a plurality of base stations or access points, a plurality of wireless communication devices and a network hardware component.

FIG. 1 is a functional block diagram illustrating a communication system 10 that includes a plurality of base stations or access points (AP) 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
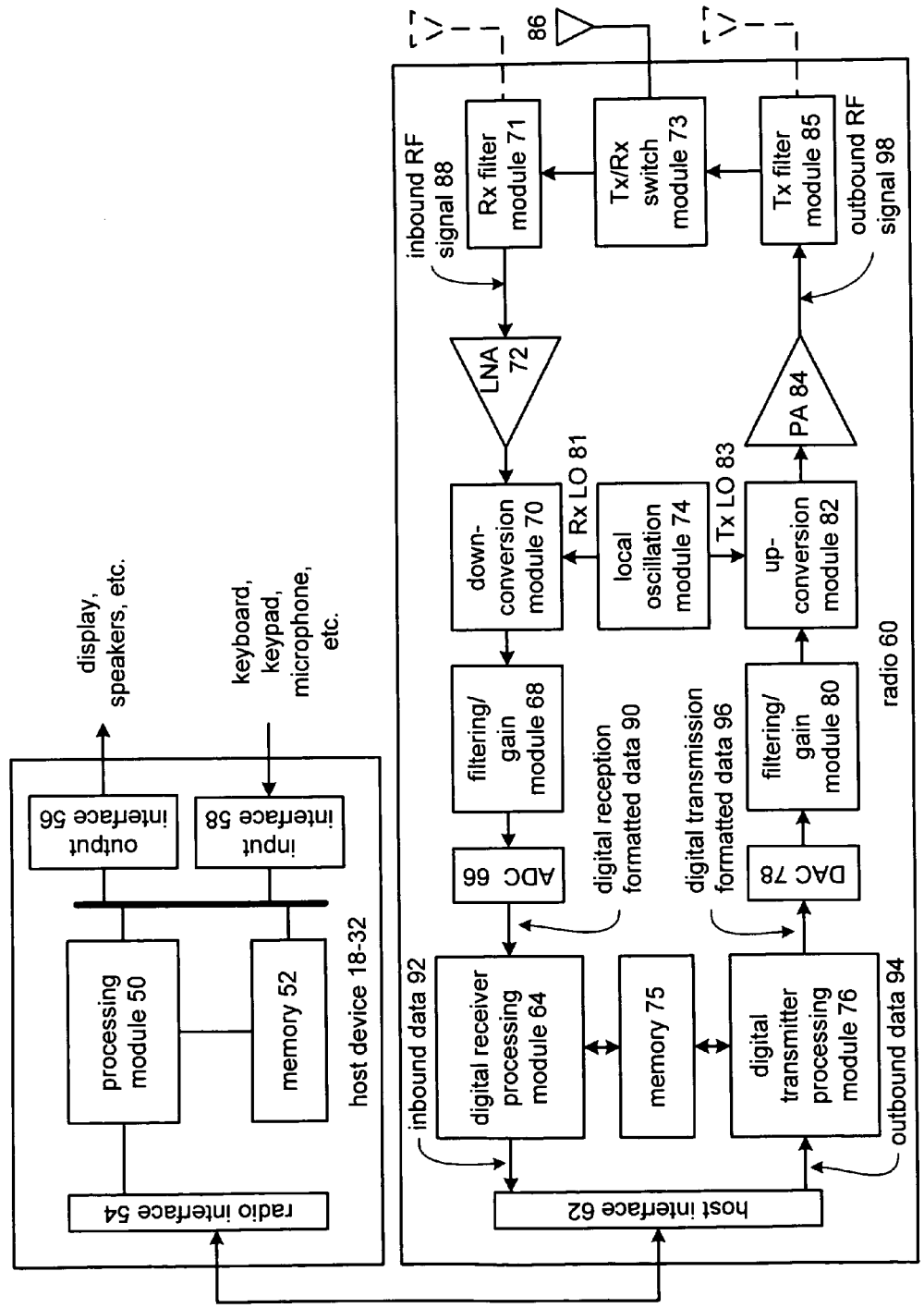
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistant hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of 100 kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an is RF signal based on a transmitter local oscillation signal 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for up-conversion module 82 and down-conversion module 70, it is required to provide accurate frequency conversion. For the down-conversion module 70 and up-conversion module 82 to accurately mix a signal, however, it is important that the local oscillation module 74 provides an accurate local oscillation signal for mixing with the baseband or RF by the up-conversion module 82 and down-conversion module 70, respectively. Accordingly, the local oscillation module 74 includes circuitry for adjusting an output frequency of a local oscillation signal provided therefrom. As will be explained in greater detail below, the local oscillation module 74 receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understood that the principles herein may also be applied readily to systems that implement an intermediate frequency conversion step at a low intermediate frequency. The present invention may readily be inserted in any one of the various circuit blocks or devices of FIGS. 1 and 2.

Figure 3:
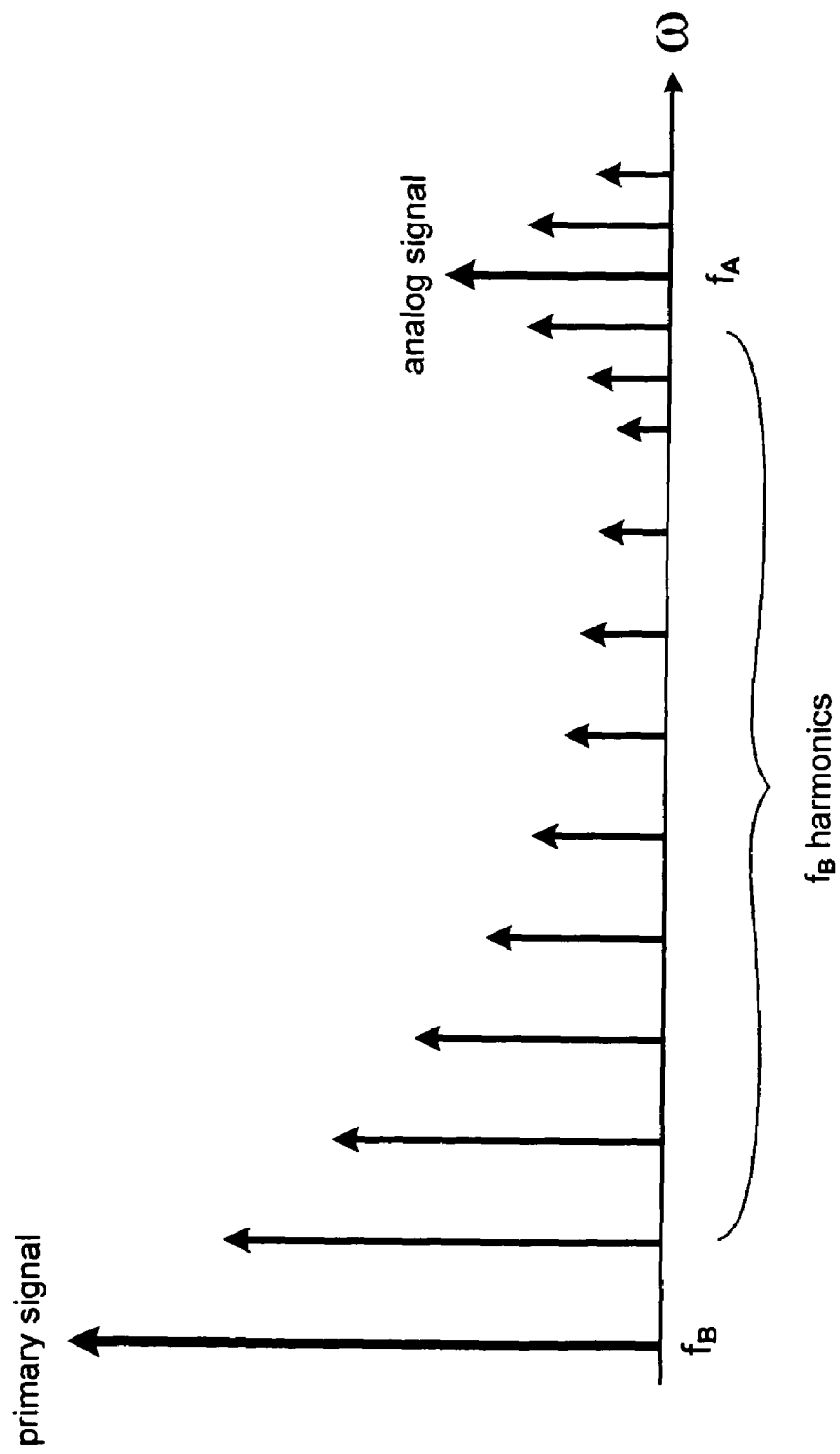
FIG. 3 is a signal diagram illustrating a plurality of harmonic signals for a digital clock and that such harmonics may be amplified within an analog portion of a mixed signal device.

FIG. 3 is a signal diagram illustrating a plurality of harmonic signals for a digital clock and that such harmonics may be amplified within an analog portion of a mixed signal device. As may be seen, a primary signal at a frequency $f_B$ includes a series of harmonics. If, for example, the primary signal is a digital clock signal from a digital portion of a mixed signal integrated circuit, then each harmonic is an integer multiple of the fundamental frequency of the digital clock. Because the transceiver device (radio 60 of FIG. 2, for example) represented by FIG. 3 is a mixed signal device, however, analog portions of the transceiver circuit include amplifiers that operate at a specified frequency with a specified bandwidth. Those amplifiers may receive and amplify the harmonics within the bandwidth of the amplifier if such harmonics are propagated through a substrate of the mixed signal integrated circuit transceiver. Thus, as may be seen in the example of FIG. 3, harmonics are amplified around the frequency $f_4$. Because of the tendency of an analog circuit to amplify harmonics and other substrate noise, it is desirable to block or reduce such substrate noise in the region of any sort of amplifier. It is especially advantageous to reduce such harmonics for clock based analog circuits that may well operate at a frequency of a generated harmonic signal.

Figure 4:
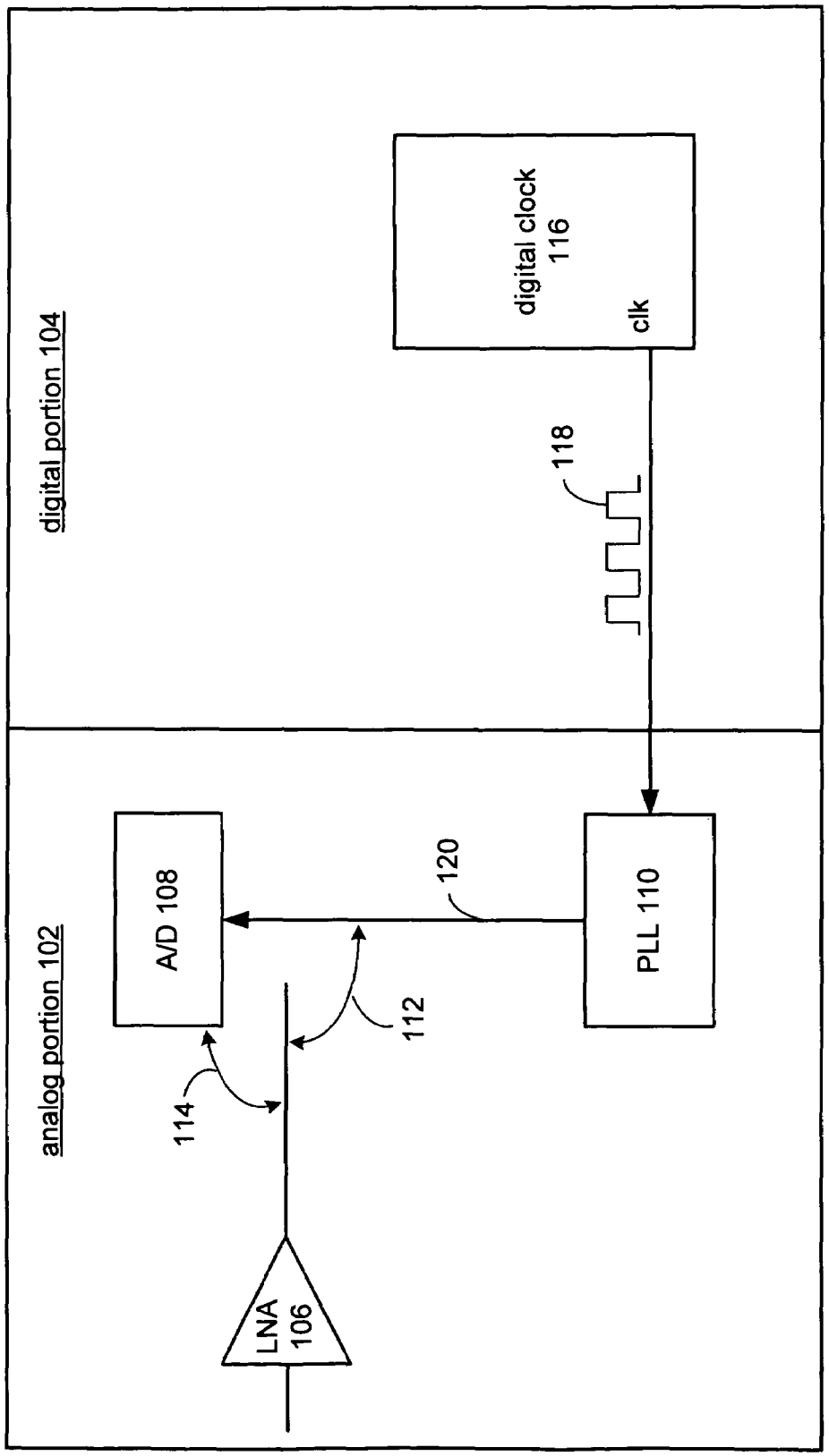
FIG. 4 is a functional block diagram of a mixed signal integrated circuit transceiver including an analog circuit portion and a digital circuit portion according to one embodiment of the present invention.

FIG. 4 is a functional block diagram of a mixed signal integrated circuit transceiver 100 including an analog circuit portion 102 and a digital circuit portion 104 according to one embodiment of the present invention. As may be seen from examining FIG. 4, at least two analog circuits within an analog portion 102 of mixed signal integrated circuit transceiver 100 have long traces that are susceptible to mutual coupling of signals carried by the long traces. More specifically, a low noise amplifier (LNA) 106, an analog-to-digital converter (A/D) 108, and a phase locked loop (PLL) 110 receive, as a result of mutual coupling 112 and mutual coupling 114, undesirable signals between long traces within mixed signal integrated circuit transceiver 100. Digital clock 116 of digital portion 104 produces a clock 118 as a reference signal to PLL 110. As may also be seen, PLL 110 produces a signal to A/D 108 representing one of a recovered clock and a recovered data over a long trace 120. In the described example, the analog blocks within analog portion 102 could possibly receive substrate noise from the other or produce substrate noise to the other. Thus, LNA 106, A/D 108, and PLL 110 will experience increased levels of substrate noise from digital clock 116 of digital portion 104. Generally, within an integrated circuit, several types of coupling may interfere with desired operation of a circuit block. For example, substrate coupling, inductive coupling, capacitive coupling as well as clock feedthrough can provide interference for a circuit block.

One aspect of the present invention includes a plurality of resistors in line with the long traces to reduce the effects of the aforementioned types of coupling and of clock feedthrough. The in-line resistors and parasitic capacitance appearing on a particular trace form a low pass filter to substantially reduce the high frequency noise. In one embodiment of the present invention, a resistive block includes a plurality of series coupled resistors formed with shorts across the resistors wherein the shorts are removed as necessary to a desired zero of the low pass filter transfer function. In an alternate embodiment, the resistive block includes a plurality of shorted parallel coupled resistors. The function of removing the shorts will be discussed with respect to FIG. 6 and FIG. 7.

Figure 5:
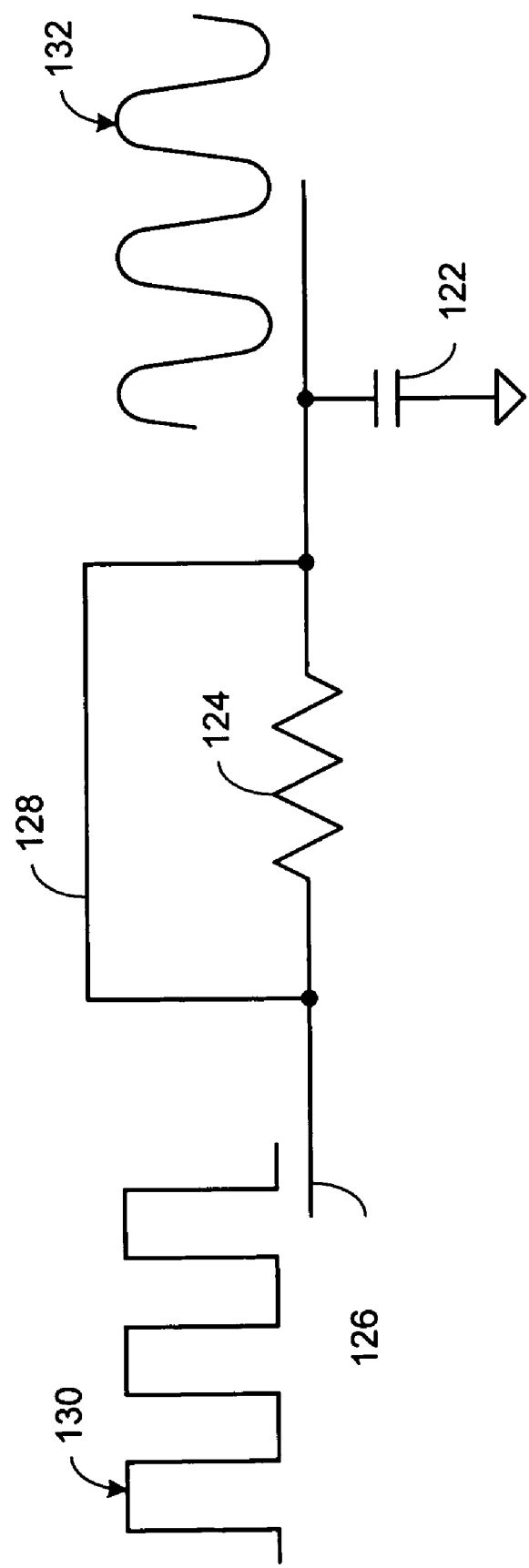
FIG. 5 is a schematic diagram of one embodiment of the present invention.

FIG. 5 is a schematic diagram of one embodiment of the present invention. Generally, the invention includes placing a shorted resistor in line with a long trace and determining whether to remove the short across the resistor. Generally, long traces operating at a high frequency includes a notable parasitic capacitance, which is represented herein as capacitor 122. Accordingly, a resistor 124 that is formed in-line with trace 126 may, along with capacitor 122, form a low pass filter for removing high frequency noise components. As may be seen, however, resistor 124 is formed with a short 128 across its terminals, effectively shorting out resistor 124. If short 128 is removed from resistor 124, a square wave input, shown as signal 130, when produced through the filter formed by resistor 124 and capacitor 122, produces a rounded sinusoidal signal 132 indicating the removal of some high frequency components. Because the square wave is converted to sinusoidal signal 132, the 0 crossing points may change due to the waveform being more susceptible to interference from, for example, cross coupling, thereby creating some jitter or phase shift in the output signal. Accordingly, FIG. 5 represents a trade-off that results from either leaving or removing short 128. A benefit of removing short 128 is that an R-C filter is formed to couple spurs to ground. A detriment, however, is the change to the output waveform, as represented by sinusoidal signal 132, relative to input signal 130. Accordingly, through a trial and error method, a sample chip may have short 128 removed and the overall system performance may be evaluated to determine whether the cure is worse or better than the ailment. Generally, resistor 124 is formed as close to a clock source as possible in the described embodiment of the invention.

FIG. 6 is a functional schematic block diagram of a plurality of resistors formed within a resistive block 134 in an integrated circuit that are each shorted and coupled in series relative to each other. As is known by one of average skill in the art, a resistor is formed by creating an area of resistive material having a defined resistivity constant, a length (L) and a cross-sectional area (S). The resistive value of the resistor is a function of the resistivity constant multiplied by the length of the resistor and divided by the cross-sectional area of the resistor. Each of the resistors shown in FIG. 6, namely, resistors 136, 138 and 140, are shorted by shorts 142, 144 and 146, respectively. Each of resistors 136, 138 and 140, is characterized by a length "L" and by a total cross-sectional area of "3S". Thus, for each resistor, the total resistance is equal to the resistivity constant multiplied by "L" and divided by "3S". If all three shorts 142, 144 and 146 are removed, the total resistance is equal to the resistivity constant multiplied by "L" divided by "S". In the embodiment of FIG. 6, as resistance is increased to increase the filtering capability of the R-C filter formed by the resistor and the parasitic capacitance, as discussed in relation to FIG. 5, the short is initially removed from the resistor closest to the clock source that produces a clock onto the trace. Accordingly, if the clock source is closest to resistor 136, then short 142 is initially removed. If additional resistance is desired, shorts 144 and 146 are removed, in that order, in the described method and embodiment of the present invention.

FIG. 7 shows an alternate embodiment of a plurality of resistors formed in-line with a long trace. As may be seen, a plurality of resistors 150, 152, and 154 are all formed and coupled in parallel within a resistive block 148. The three resistors 150, 152, and 154 are further shorted by a short 156. Accordingly, the present invention and method therefore includes initially removing short 156 thereby placing all three resistors 150, 152, and 154 that are coupled in parallel in-line with the trace. If each of the resistors 150, 152 and 154 is characterized by the same length "L" and the same cross sectional area "S", then the total resistance with only short 156 removed is equal to the resistivity constant multiplied by "L" and divided by "3S". If, however, any two of traces 158, 160 and 162 are removed, thereby leaving only one resistor coupled in-line with the trace, then the total resistance is given by the resistivity constant times "L" divided by "S". One advantage of the embodiment of FIG. 7 relative to FIG. 6, is that similar resistance values may be obtained by selectively removing short 156 and any one of traces 158, 160 and 162, according to the desired final resistive value to achieve the same resistive values that may be achieved through the embodiment of FIG. 6 while, at the same time, consuming substantially less IC real estate. More specifically, the total IC real estate of the embodiment of FIG. 7 is approximate ⅓ that of FIG. 6 and is therefore advantageous although the amount of IC real estate is relatively small for either configuration. Other considerations for the embodiments of FIGS. 6 and 7 relate to the size of the resistance and. For larger desired resistances, the configuration of FIG. 6 may be advantageous (IC real estate efficient) while the configuration of FIG. 7 may be advantageous for smaller resistance values. The embodiment of FIG. 6 is also advantageous in that precise resistive values are more easily obtained because of scaling precision considerations.

Figure 8A:
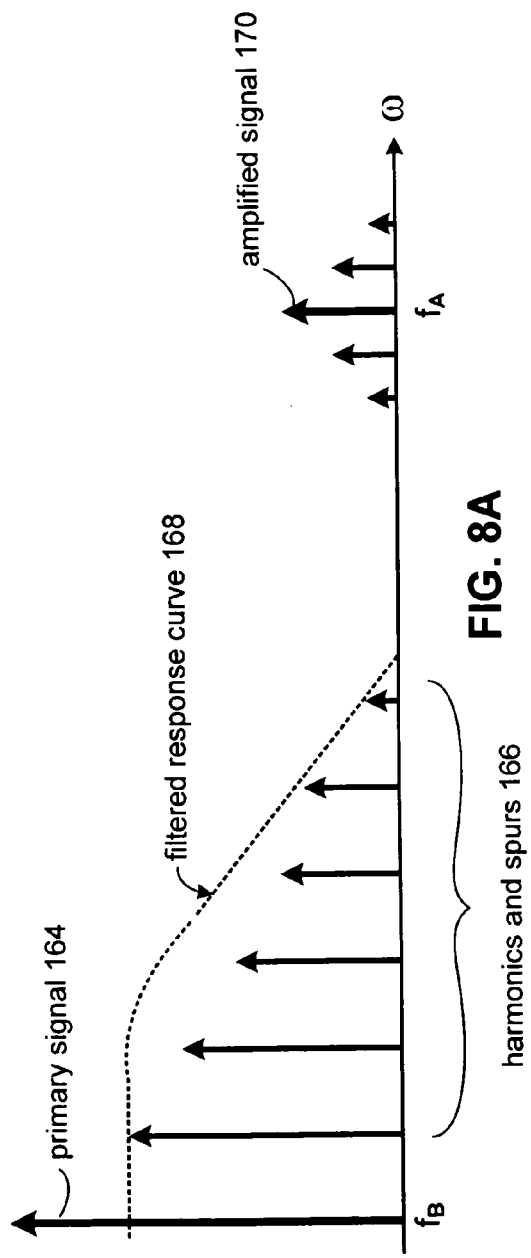
FIGS. 8A and 8B are signal response diagrams illustrating one advantage of placing a resistive value in-line with a long trace within a substrate.
Figure 8B:
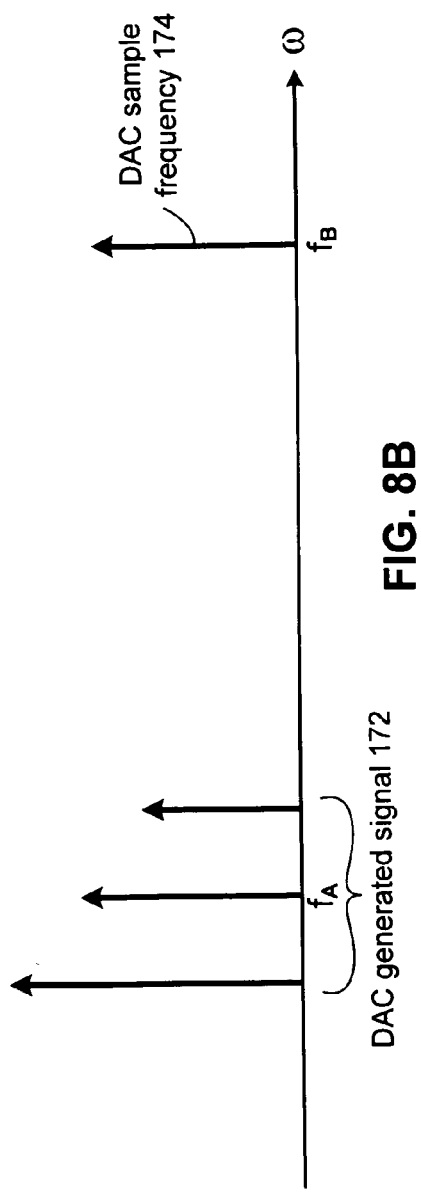

FIGS. 8A and 8B are signal response diagrams illustrating one advantage of placing a resistive value in-line with a long trace within a substrate. As may be seen from referring to FIG. 8A, a primary signal 164, for example, a clock signal, generates a plurality of harmonics shown at 166. Utilizing an R-C filter that is created by unshorting a resistor along with parasitic capacitance, however, produces a filtered response curve, represented by 168. Accordingly, harmonics and spurious signals (spurs), are attenuated to a point that analog circuitry within a mixed signal integrated circuit transceiver device does not amplify any significant amount of the harmonics and spurs when operating at a frequency $f_A$, such as shown at 170. Accordingly, the amplified signal at $f_A$ includes significantly reduced harmonics if any. FIG. 8B illustrates another type of interference that may be reduced according to the embodiments of the present invention. More specifically, a digital-to-analog converter (DAC) that produces a DAC generated signal 172 typically has a sample frequency 174 that is at least twice as high as a frequency of the DAC generated signal 172. Spurs generated by the DAC sample frequency may appear in the desired frequency band. Accordingly, adding the in-line resistor according to the described embodiments of the invention may operate to reduce the presence and impact of such spurs.

FIG. 9 is a flowchart illustrating a method for producing integrated circuit radio frequency transceivers according to one embodiment of the present invention. Initially, the invention includes producing a sample of an integrated circuit radio frequency transceiver forming a plurality of traces on top of a metal layer and forming a shorted resistive block in-line with at least one long trace of a plurality of traces (step 180). The resistive block comprises at least one resistor and, if more than one, each resistor can comprise resistors that are either series coupled or parallel coupled. In the case of series coupled resistors, each resistor includes a short across its terminals. In the case of parallel coupled resistors, one short or trace is operable to short out all of the resistors in the resistive block. Thereafter, the invention includes evaluating real performance of the sample of the integrated circuit radio frequency transceiver (step 182). The performance is evaluated and stored for comparison at a later step in the process. Thereafter, unless the performance is within a specified threshold, the invention includes determining whether harmonic interference may need to be reduced (step 184). Assuming that harmonic interference or spurs through the substrate do need to be reduced, the invention includes selecting a first trace of the at least one trace and removing a short across at least one shorted resistor of the resistive block to form an unshorted resistive block (step 186). This unshorted resistive block, along with parasitic capacitance at high operating frequencies, forms an effective RC filter for removing spurs and harmonics. Thereafter, the invention includes producing the integrated circuit radio frequency transceivers with the unshorted resistive block (step 188). Because the resistive blocks are formed on a top metal layer of the integrated circuit, only a top layer mask needs adjusting to modify the design to produce the integrated circuit radio transceivers with the unshorted resistive blocks. In one embodiment of the invention, wherein a plurality of resistors are formed on the top metal layer, the invention may also include evaluating the performance of the sample with the removed short of the unshorted resistive block (step 190). Thus, the invention may also include removing shorts across additional resistors of the first trace. The invention may also include, however, selecting a second trace of the at least one trace, and removing a short across at least one shorted resistive block of the second block to form an unshorted resistive block of the second trace (step 192). In such a case, the step of producing an integrated circuit radio frequency transceiver includes producing transceivers with unshorted resistive blocks having at least two shorts removed (step 194). One advantageous aspect of the above steps is that forming such traces on a lap layer facilitates using focused ion beam cutting to achieve the desired circuit connectivity in place of re-fabricating a design with a new mask. Thus, speed of response and reduced cost are some of the benefits of the described embodiments of the invention. Moreover, the optimum configuration may be determined prior to committing to expense mask development and finalization.

FIG. 10 is a flowchart illustrating a method according to the present invention for producing an integrated circuit radio frequency transceiver. Initially, the inventive method includes producing a sample of an integrated circuit radio frequency transceiver, the step of producing the sample further including forming a plurality of traces on a top metal layer and forming a shorted resistive block in-line with at least one trace of a plurality of traces wherein the resistive block includes a plurality of series coupled resistors, each resistor of the plurality of series coupled resistors having a short across the resistor (step 196). Thereafter, the invention includes evaluating real performance of the sample of the integrated circuit radio frequency transceiver (step 198) and determining whether harmonic interference needs to be reduced (step 200). Presuming that harmonic interference may need to be reduced, the invention includes selecting and removing a first short across a first resistor of the plurality of series coupled resistors to create an RC filter resulting from a coupling of parasitic capacitance of the trace and the unshorted first resistor wherein the unshorted first resistor is physically closest to an end of the at least one trace (step 202). Thereafter, the invention includes producing the integrated circuit radio frequency transceivers with the unshorted first resistor (step 204). The invention may also include evaluating real performance of the sample with the unshorted first resistor (step 206) and, if necessary, removing a short across a shorted second resistor of the plurality of series coupled resistors to form an unshorted second resistor wherein the unshorted second resistor is coupled in series with the unshorted first resistor (step 208). Finally, the invention includes determining whether to further increase a resistance value of the at least one trace by removing a short across a third resistor coupled in series with the first and second resistors of the at least one trace (step 210).

Figure 11:
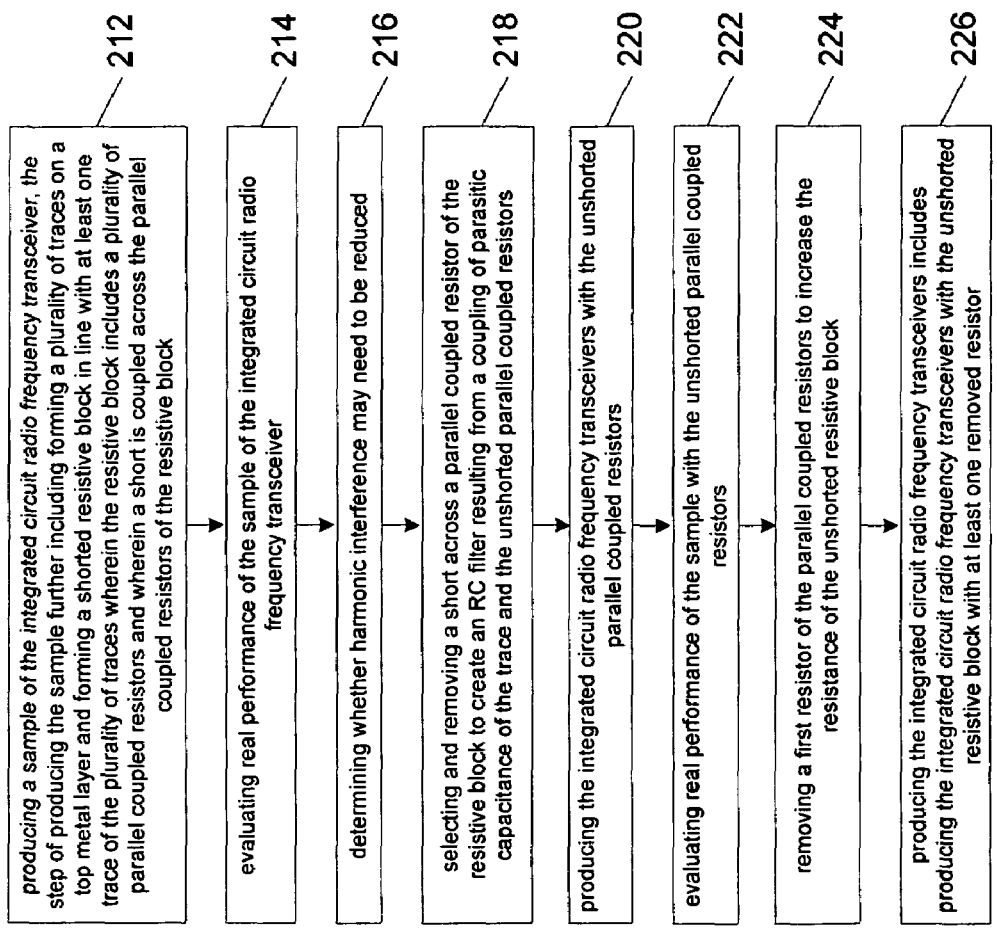
FIG. 11 is a flowchart illustrating an alternate method for producing an integrated circuit radio frequency transceiver.

FIG. 11 is a flowchart illustrating an alternate method for producing an integrated circuit radio frequency transceiver. Initially, the invention includes producing a sample of an integrated circuit radio frequency transceiver, the step of producing the sample further including forming a plurality of traces on a top metal layer and forming a shorted resistive block in-line with at least one trace of the plurality of traces wherein the resistive block includes a plurality of parallel coupled resistors and wherein a short is coupled across the parallel coupled resistors of the resistive block (step 212). Once the sample is produced, the invention includes evaluating real performance of the sample of the integrated circuit radio frequency transceiver (step 214) and determining whether harmonic interference or spurs in the substrate need to be reduced (step 216). The invention further includes selecting and removing a short across a parallel coupled resistor of the resistive block to create an RC filter resulting from a coupling of parasitic capacitance of the trace and the unshorted parallel coupled resistors (step 218). Thereafter, the invention includes producing the integrated circuit radio frequency transceivers with the unshorted parallel coupled resistors (step 220). The invention may further include evaluating real performance of the sample with the unshorted parallel coupled resistors (step 222) and, if necessary, removing a first resistor of the parallel coupled resistors to increase the resistance of the unshorted resistive block (step 224). In the described embodiment of the invention, because the resistors are coupled in parallel, removing a trace or lead line to one of the resistors effectively increases the total resistance of the resistive block because a resistor has been removed from being coupled in parallel with the other resistor(s). Accordingly, the invention includes producing the integrated circuit radio frequency transceivers with the unshorted resistive block with at least one removed resistor (step 226). It is understood that steps 224 and 226 may be repeated to remove additional resistors to determine if the increased filtration that results from the RC filter created by the resistors and the parasitic capacitance is further improving or degrading performance. Accordingly, once performance degrades after one or more resistors have been removed, or even after the short has been removed that places all of the resistors into coupling, one of average skill in the art may readily determine whether it is advantageous to create the RC filter and, if so, with what resistance value for optimum performance using the method described above.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A method for forming an integrated circuit radio frequency transceiver with reduced harmonic interference from undesired coupling, comprising:
   producing a sample of the integrated circuit radio frequency transceiver, the step of producing the sample further including:
   forming a plurality of signal traces on a top metal layer, the plurality of signal traces being operably disposed to carry ingoing signals on a receive path or outgoing signals on a transmit path of the integrated circuit radio frequency transceiver; and
   forming a resistive block in line with at least one signal trace of the plurality of signal traces wherein the resistive block comprises an input and an output and at least one resistive element and at least one trace, wherein the at least one resistive element and the at least one trace of the resistive block are operably disposed in parallel between the input and output of the resistive block and wherein the at least one trace of the resistive block is operable to short the at least one resistive element;

evaluating real performance of the sample of the integrated circuit radio frequency transceiver;

determining whether harmonic interference may need to be reduced;

selecting a first trace of the at least one trace and removing a short across at least one shorted resistive element of the resistive block operably disposed in line with the first trace to form an unshorted resistive block; and producing the integrated circuit radio frequency transceiver with the unshorted resistive block.

2. The method of claim 1 further including evaluating real performance of the sample with the removed short of the unshorted resistive block.

3. The method of claim 2 further including evaluating real performance of the sample with the removed short of the unshorted resistive block.

4. The method of claim 2 further including selecting a second trace of the at least one trace and removing a short across at least one shorted resistive block of the second trace to form an unshorted resistive block of the second trace.

5. The method of claim 4 wherein the step of producing the integrated circuit radio frequency transceiver includes producing transceivers with the unshorted resistive block having at least two shorts removed.

6. The method of claim 2 further including determining whether to increase a resistance value of the unshorted resistive block of the second trace.

7. The method of claim 1 wherein the step of removing the short across at least one shorted resistor of the resistive block includes removing shorts across resistors that result in two resistors being coupled in series.

8. The method of claim 1 wherein the step of removing the short across at least one shorted resistor of the resistive block includes removing shorts across resistors that result in two resistors being coupled in parallel.

9. A method for forming an integrated circuit radio frequency transceiver with reduced harmonic interference from undesired coupling, comprising:

producing a sample of the integrated circuit radio frequency transceiver, the step of producing the sample further including:

forming a plurality of traces on a top metal layer, the plurality of traces being operably disposed to carry receive path or transmit path signals of the integrated circuit radio frequency transceiver; and forming a resistive block in line with at least one signal trace of the plurality of signal traces wherein the resistive block comprises an input and an output and at least one resistive element and at least one trace, wherein the at least one resistive element and the at least one trace of the resistive block are operably disposed in parallel between the input and output of the resistive block and wherein the at least one trace of the resistive block is operable to short the at least one resistive element;

evaluating real performance of the sample of the integrated circuit radio frequency transceiver;

determining whether harmonic interference may need to be reduced;

selecting and removing a first short across a first resistor operably disposed in line with the first trace of the plurality of series coupled resistors to create an RC filter resulting from a coupling of parasitic capacitance of the trace and an unshorted first resistor; and producing the integrated circuit radio frequency transceiver with the unshorted first resistor.

10. The method of claim 9 further including evaluating real performance of the sample with the unshorted first resistor.

11. The method of claim 10 wherein the unshorted first resistor is physically closest to an end of the at least one trace.

12. The method of claim 10 further including removing a short across a shorted second resistor to form an unshorted second resistor wherein the unshorted second resistor is coupled in series with the unshorted first resistor.

13. The method of claim 12 wherein the step of producing the integrated circuit radio frequency transceiver includes producing the integrated circuit radio frequency transceiver with the unshorted first and second resistors.

14. The method of claim 10 further including determining whether to increase a resistance value of the at least one trace by removing a short across a third resistor coupled in series with the first and second resistors of the at least one trace.

15. A method for forming an integrated circuit radio frequency transceiver with reduced harmonic from undesired coupling, comprising:

producing a sample of the integrated circuit radio frequency transceiver, the step of producing the sample further including:

forming a plurality of traces on a top metal layer, the plurality of traces being operably disposed to carry receive path or transmit path signals of the integrated circuit radio frequency transceiver; and forming a resistive block in line with at least one signal trace of the plurality of signal traces wherein the resistive block comprises an input and an output and at least one resistive element and at least one trace, wherein the at least one resistive element and the at least one trace of the resistive block are operably disposed in parallel between the input and output of the resistive block and wherein the at least one trace of the resistive block is operable to short the at least one resistive element;

evaluating real performance of the sample of the integrated circuit radio frequency transceiver;

determining whether harmonic interference may need to be reduced;

selecting and removing the short across the parallel coupled resistors of the resistive block to create an RC filter resulting from a coupling of parasitic capacitance of the trace and unshorted parallel coupled resistors; and producing the integrated circuit radio frequency transceiver with the unshorted parallel coupled resistors.

16. The method of claim 15 further including evaluating real performance of the sample with the unshorted parallel coupled resistors.

17. The method of claim 16 further including removing a first resistor of the parallel coupled resistors to increase the resistance of an unshorted resistive block.

18. The method of claim 17 wherein the step of producing the integrated circuit radio frequency transceiver includes producing the integrated circuit radio frequency transceiver with the unshorted resistive block with at least one removed resistor.

19. The method of claim 18 further including determining whether to increase a resistance value of the resistive block by removing a second resistor coupled in parallel within the resistive block.

20. An integrated circuit radio transceiver, comprising:

front end transceiver circuitry for receiving and transmitting wireless communication signals wherein the front end transceiver front-end processes received RF signals and converts the processed signals to digital signals and converts outgoing digital signals to analog and upconverts the outgoing analog signals to RF and amplifies outgoing RF signals;

wherein the front end transceiver circuitry includes a plurality of traces on a top metal layer, the plurality of traces being operably disposed to carry receive path or transmit path signals of the integrated circuit radio frequency transceiver; and a resistive block in line with at least one trace of the plurality of traces wherein the resistive block comprises an input and an output and at least one resistive element and at least one trace, wherein the at least one resistive element and the at least one trace of the resistive block are operably disposed in parallel between the input and output of the resistive block and wherein the at least one trace of the resistive block is operable to short the at least one resistive element.

21. An integrated circuit radio transceiver, comprising:

front end transceiver circuitry for receiving and transmitting wireless communication signals wherein the front end transceiver front-end processes received RF signals and converts the processed signals to digital signals and converts outgoing digital signals to analog and upconverts the outgoing analog signals to Rf and amplifies outgoing RF signals;

wherein the front end transceiver circuitry includes a plurality of traces on a top metal layer; and a resistive block in line with at least one trace of the plurality of traces wherein the resistive block comprises an input and an output and at least one resistive element and at least one trace, wherein the at least one resistive element and the at least one trace of the resistive block are operably disposed in parallel between the input and output of the resistive block and wherein the at least one trace of the resistive block is operable to short the at least one resistive element.

* * * * *